United States Patent
Ling et al.

(10) Patent No.: US 6,819,155 B1
(45) Date of Patent: Nov. 16, 2004

(54) HIGH-SPEED DUTY CYCLE CONTROL CIRCUIT

(75) Inventors: Kuok Ling, Calabasas, CA (US); Martin Kulas, Westlake Village, CA (US)

(73) Assignee: Teradyne, Inc., Boston, MA (US)

(*) Notice: Subject to any disclaimer, the term of this patent is extended or adjusted under 35 U.S.C. 154(b) by 0 days.

(21) Appl. No.: 10/601,688

(22) Filed: Jun. 23, 2003

(51) Int. Cl.[7] .............................................. H03K 3/017
(52) U.S. Cl. ...................................... 327/175; 327/172
(58) Field of Search ................................. 327/170–175

(56) References Cited

U.S. PATENT DOCUMENTS

| | | | |
|---|---|---|---|
| 6,208,199 B1 * | 3/2001 | Andersson | 327/561 |
| 6,366,115 B1 | 4/2002 | DiTommaso | 326/32 |
| 6,441,663 B1 | 8/2002 | Chuang et al. | 327/206 |
| 6,469,493 B1 | 10/2002 | Muething, Jr. et al. | 324/158.1 |
| 6,476,645 B1 | 11/2002 | Barnes | 327/51 |
| 6,501,313 B2 | 12/2002 | Boerstler et al. | 327/175 |
| 6,535,015 B1 | 3/2003 | Krishnan et al. | 324/769 |
| 6,566,925 B2 | 5/2003 | Ma | 327/175 |
| 6,593,789 B2 * | 7/2003 | Atallah et al. | 327/175 |
| 6,600,338 B1 * | 7/2003 | Nguyen et al. | 326/68 |
| 6,643,790 B1 * | 11/2003 | Yu et al. | 713/500 |

OTHER PUBLICATIONS

Published U.S. patent application No. 2002/0079939 to Nair et al.
Published U.S. patent application No. 2003/0016065 to Harrison et al.

* cited by examiner

*Primary Examiner*—Timothy P. Callahan
*Assistant Examiner*—Cassandra Cox
(74) *Attorney, Agent, or Firm*—Teradyne Legal Department

(57) ABSTRACT

A duty cycle correction circuit for changing the duty cycle for a differential periodic signal is disclosed. The duty cycle correction circuit includes input circuitry for receiving a first differential signal. The differential signal exhibits a first signal component and a complement signal component, each of the components having initial high and low signal levels and respective first and second DC bias levels. The input circuitry includes a differential output having a first path for propagating the first signal component and a second path for propagating the complement signal component. Programmable load circuitry couples to the differential output and includes a programmable input. The load circuitry operates to programmably vary the DC bias level of at least one of the signal components. A differential gain amplifier is coupled to the first differential output and disposed downstream of the load circuitry.

13 Claims, 4 Drawing Sheets

HIGH-SPEED DUTY CYCLE CONTROL CIRCUIT

FIELD OF THE INVENTION

The invention relates generally to automatic test equipment, and more particularly circuits for controlling the duty cycle of high-speed differential clock signals.

BACKGROUND OF THE INVENTION

Many digital electronic systems require a periodic clock signal to synchronize the operations of various system sub-circuits. Most systems perform optimally when the clock duty cycle (the ratio of pulse width to total cycle time) is 50%, or 50/50. A 50% duty cycle is especially important for high speed semiconductor testing applications, such as timing generation circuitry, due to the desirability of a balanced jitter-free output.

FIG. 1A illustrates a single-ended clock signal having an ideal 50% duty cycle. For each period, half the waveform is above a DC bias point, at 10 (in phantom), and half the waveform is below. A degraded clock signal exhibiting a 60/40 duty cycle is also shown in FIG. 1A.

Unfortunately, establishing and maintaining a 50% duty cycle at high frequencies has proven problematic. This is especially true for systems that employ differential clock circuitry. A differential clock signal has two complementary signal components, either one of which may affect the resulting duty cycle if degraded or delayed with respect to one another in any way. FIG. 1B exhibits a differential clock signal corresponding to the 60/40 waveform of FIG. 1A.

In the field of automatic test equipment, one alleged solution to controlling the duty cycle for a high-speed clock is proposed by DiTommaso, in U.S. Pat. No. 6,366,115. This proposal describes employing a buffer circuit having rising and falling edge delay circuits along with a signal path error correction circuit and a temperature-related error correction circuit to correct for duty cycle errors.

In operation, the rising and falling delay circuits receive error correction signals from the signal path error correction circuit and the temperature related error correction circuit. By shifting both the rising and falling edge delays according to a feedback loop that provides a signal indicative of the actual duty cycle, the output waveform may be modified to reflect a 50% duty cycle.

While the DiTommaso proposal appears beneficial for its intended applications, the amount of circuitry employed to achieve a closed-loop system, to delay both the rising and falling edges, and correct for signal path errors and temperature related errors may be undesirable for at-speed high performance testing. This may be especially true for timing-related circuitry operating at frequencies in excess of 2 gigahertz.

What is needed and as yet unavailable is a duty cycle correction circuit for differential clock signals that provides accurate duty cycle control with minimal additional circuitry and complexity. The duty cycle control circuit of the present invention satisfies these needs.

SUMMARY OF THE INVENTION

The high-speed duty cycle control circuit of the present invention provides high accuracy control for establishing a desired duty cycle for high speed differential signals. Moreover, the control circuit accomplishes this with minimal additional circuitry and low complexity.

To realize the foregoing advantages, the invention in one form comprises a duty cycle correction circuit for changing the duty cycle for a differential periodic signal. The duty cycle correction circuit includes input circuitry for receiving a first differential signal. The differential signal exhibits a first signal component and a complement signal component, each of the components having initial high and low signal levels and respective first and second DC bias levels. The input circuitry includes a differential output having a first path for propagating the first signal component and a second path for propagating the complement signal component. Programmable load circuitry couples to the differential output and includes a programmable input. The load circuitry operates to programmably vary the DC bias level of at least one of the signal components. A differential gain amplifier constructed similar to the input circuitry is coupled to the first differential output and disposed downstream of the load circuitry.

In another form, the invention comprises a method of changing the duty cycle of a differential signal having a first signal component and a complement signal component. Each of the signal components have initial high and low signal levels and respective DC bias levels. The method includes the steps: modifying the DC bias level of one of the signal components to a desired level, the modified signal component cooperating with the other signal component to form a modified differential signal; and restoring the initial high and low signal levels.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which FIG. 1A are single-ended waveforms having an ideal 50/50 duty cycle and a 60/40 duty cycle.

DETAILED DESCRIPTION OF THE INVENTION

The duty cycle control circuit of the present invention provides a straightforward and low-cost way to correct the duty cycle for differential clock waveforms. This allows circuitry having a high-accuracy differential clock input to operate at optimal performance levels.

Figure 1A:
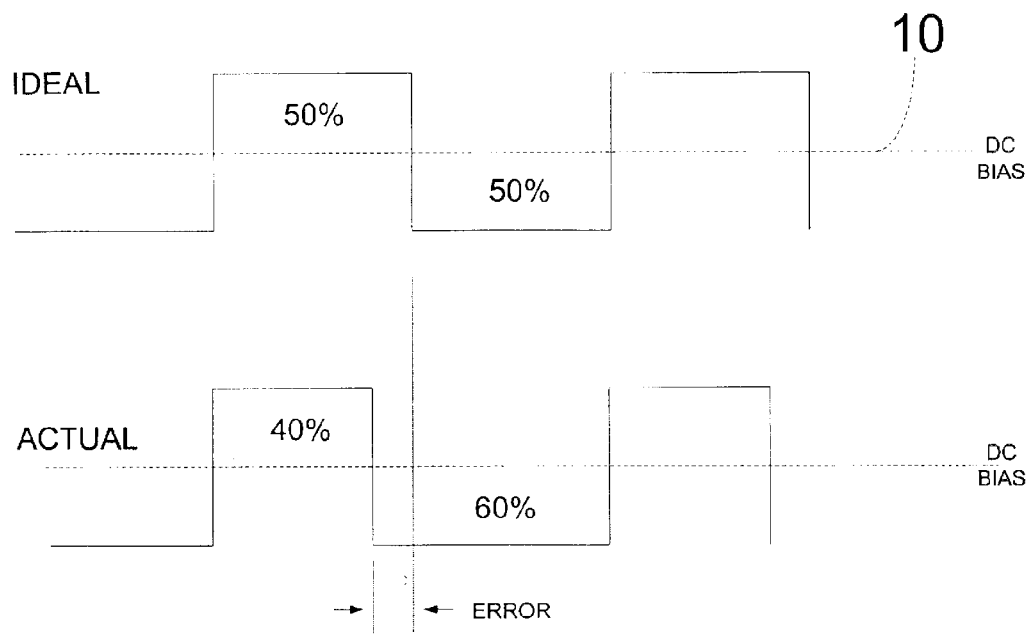
FIG. 1B is a differential waveform having an approximate 60/40 duty cycle.
Figure 1B:
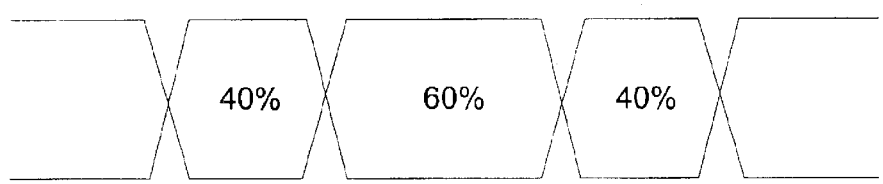
Figure 2:
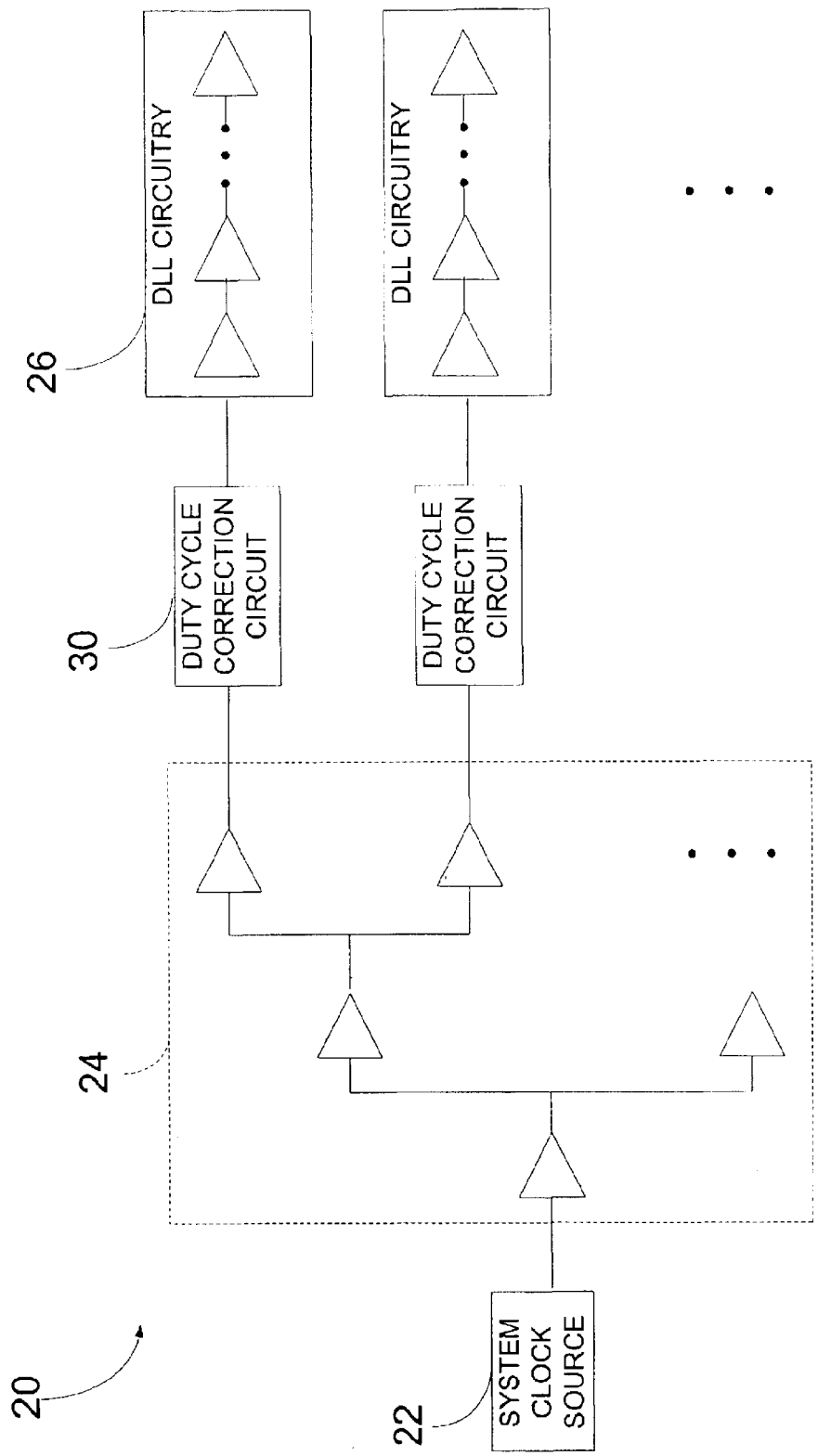
FIG. 2 is a high level block diagram of automatic test equipment employing a duty cycle control circuit in accordance with one form of the present invention.

FIG. 2 illustrates an automatic test equipment (ATE) timing circuit, generally designated 20, that employs a system differential clock source 22 for generating a differential clock waveform at a predefined frequency. As is well-known in the art, a typical differential clock waveform includes a first signal component with a desired 50% duty cycle, and a complement component. Each of the components have respective DC bias levels, and high-low signal levels typically identified as VOH and VOL.

Further referring to FIG. 2, fanout circuitry 24 in the form of buffered signal paths distribute the differential clock from the system clock source 22 to delay-locked-loop (DLL) circuitry 26 that forms the backbone for the ATE timing system. To ensure that the DLL operates in a balanced high-speed state, a duty cycle correction circuit 30 in accordance with one embodiment of the present invention is disposed between the fanout circuitry and the DLL.

Figure 3:
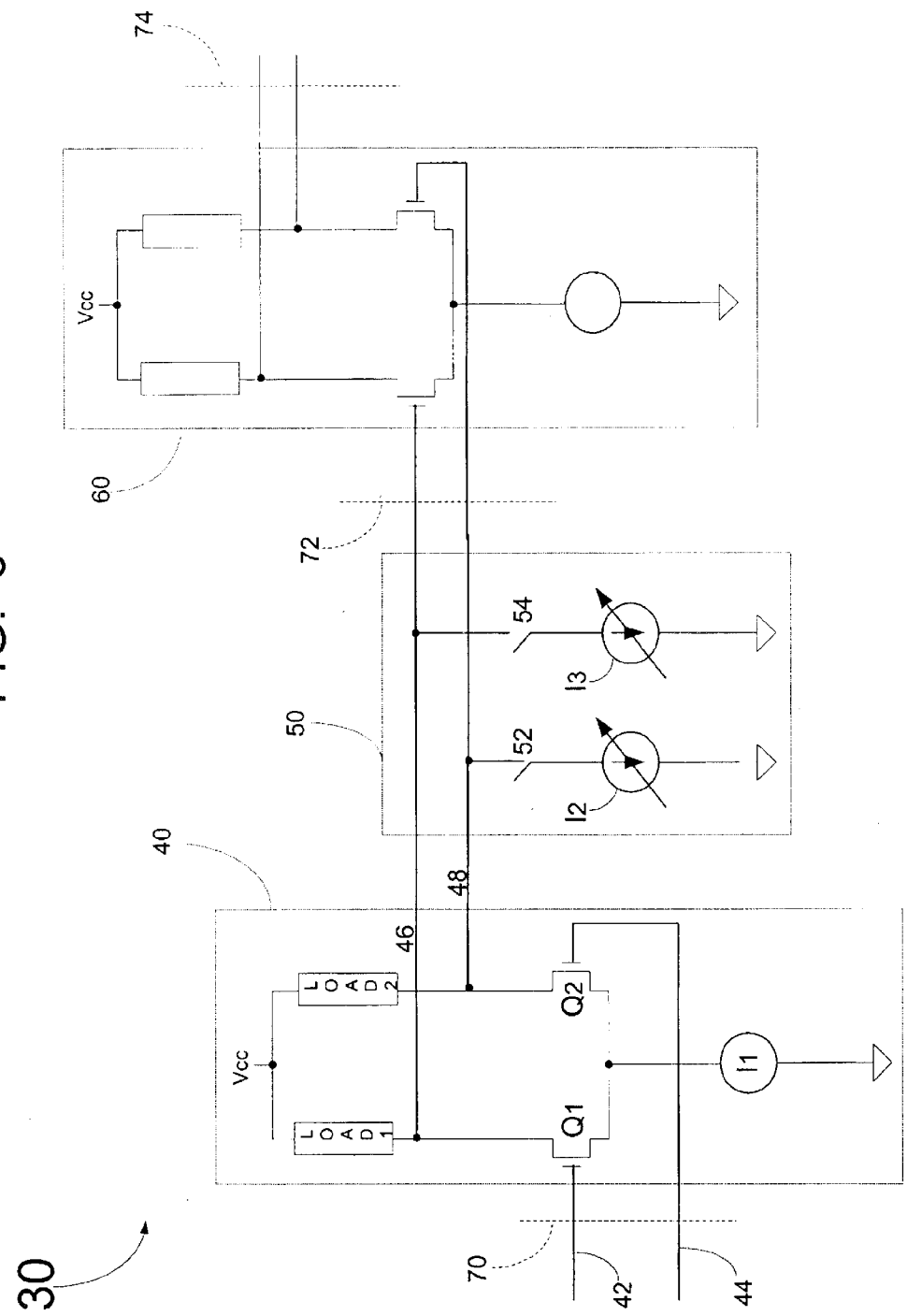
FIG. 3 is a more detailed block diagram of the duty cycle control circuit employed in FIG. 2.

With reference to FIG. 3, the duty cycle correction circuit 30 generally includes input circuitry 40 that receives the differential clock waveform and programmable load circuitry 50 to modify the waveform signal levels as more fully described below. An output differential amplifier 60 restores the modified waveform to its optimal signal levels with a corrected 50% duty cycle.

The input circuitry 40 preferably includes a first CMOS differential amplifier having respective P and N channel transistors Q1, Q2 that cooperate with a first current source I1 to effectively buffer the differential clock signal sensed at the amplifier input lines 42 and 44. DC biasing circuitry in the form of loads LOAD1, LOAD2 and supply voltage Vcc establish the DC bias levels for each signal component on each output line 46 and 48. As is well known in the art, the loads may be resistors or load transistor arrangements. The amplifier output lines for the respective signal components are coupled to the programmable load circuitry 50.

With continued reference to FIG. 3, the programmable load circuitry 50 comprises a pair of programmable current sources I2 and I3 selectively coupled to the signal component output lines 46 and 48 via switches 52 and 54. When activated, the current sources have the capability of drawing additional current through either of the bias loads LOAD1, LOAD2, thus affecting the DC bias level for one or both of the signal components.

Disposed downstream of the load circuitry 50 is a second differential amplifier 60 set up as a hybrid gain/buffer stage. The amplifier is configured similar to the first differential amplifier and has a gain greater than one, in accordance with transistor construction techniques well known in the art. This allows the stage to restore the DC levels for both signal components. The amplifier also provides a buffering capability for driving the resulting differential signal to the DLL circuitry 26 (FIG. 2).

Figure 4A:
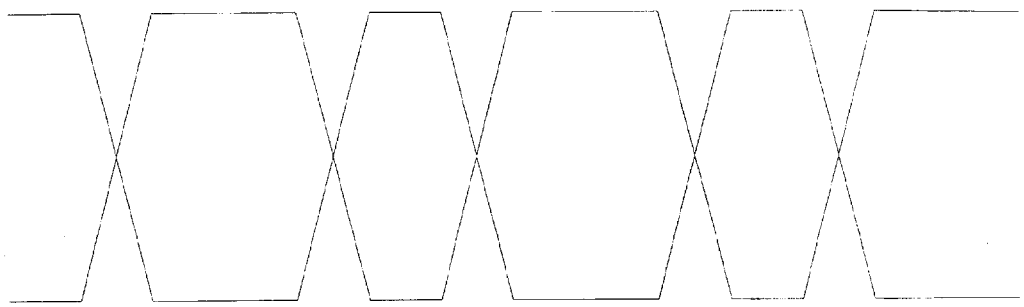
FIGS. 4A–4C are differential waveforms seen at varying test points in the duty cycle control circuit of FIG. 3.

In operation, the initially generated differential clock signal from the differential clock source 22 (FIG. 2) propagates through the fanout buffer circuitry 24 to the input circuitry 40 of the duty cycle correction circuit 30. Distortion due to mismatched loading in the buffer stages may cause the duty cycle to vary from its optimal level of 50%. Another source of duty cycle error may originate from the clock source itself. An example of the waveform characteristics at test point 70 (FIG. 3) is shown in FIG. 4A. For this example, the waveform exhibits an approximate 60/40 duty cycle.

Figure 4B:
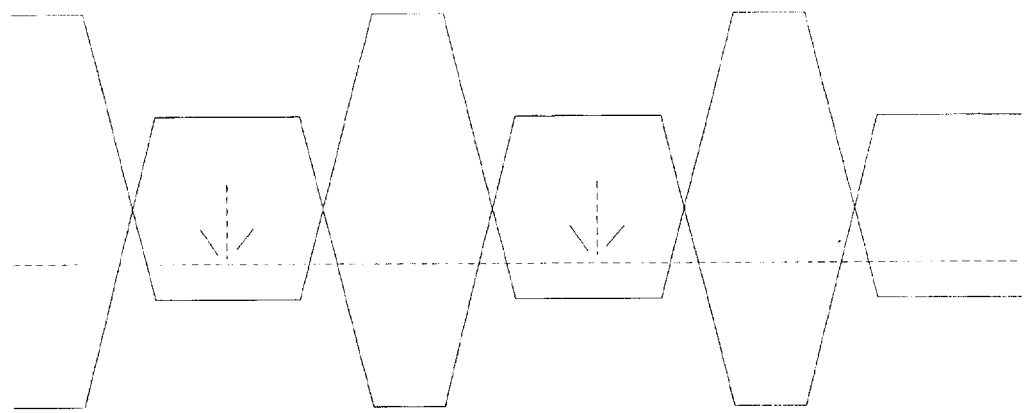

Once the known error in the duty cycle is determined, one of the current sources I2 or I3 may be programmed to load one of the signal components, thereby affecting its DC bias level. Programming is accomplished in a straightforward manner by providing a multi-bit input for the programmable load 50. For example, in one preferred embodiment, seven bits are allocated to both of the current sources (as a combined programmable load) for correcting the duty cycle as follows:

Bit 6:=enables correction
Bit 5:=increases/decreases duty cycle
Bits 4:0=control over the amount of correction Preferably, the programming described above causes a pulldown of one of the DC bias levels (shown as phantom arrows in FIG. 4B) until the resulting coincidence points define a 50% duty cycle waveform. The effect on the overall waveform as seen from test point 72 (FIG. 3) is illustrated in FIG. 4B. At this point, however, the high and low levels VOH and VOL for the differential signal components do not match, rendering the signal unusable.

Figure 4C:
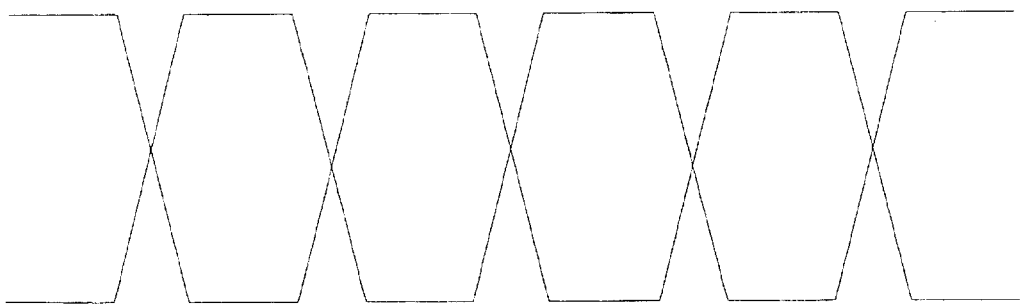

To restore the high and low signal levels VOH and VOL for the differential signal components to their original values, the entire waveform is then fed through the gain stage 60 such that the signal component average values substantially match. The final corrected differential clock waveform as seen from test point 74 (FIG. 3) is illustrated in FIG. 4C. The differential waveform is suitable for use as a high-accuracy and high-performance 50% duty cycle clock.

Those skilled in the art will appreciate the many benefits and advantages afforded by the present invention. Of significant importance is the loading of the differential signal component output lines to vary the DC bias level of one of the components, allowing for the change in duty cycle. This allows for the use of less expensive differential clock circuitry to generate the initial differential clock waveform. This, in turn, reduces the overall costs for the system, while maximizing the reliability, performance and accuracy of the circuit.

A further benefit to the present invention is that the differential amplifiers substantially match the constructions for the fanout buffer circuitry. As a result, little additional overhead in the form of discrete components is required, to enjoy the benefits of the present invention. Consequently, the invention lends itself well to high density application-specific-integrated-circuit (ASIC) implementations.

While the invention has been particularly shown and described with reference to the preferred embodiments thereof, it will be understood by those skilled in the art that various changes in form and detail may be made therein without departing from the spirit and scope of the invention. For example, while the description provided herein has focused on generating a 50% duty cycle, the correction features of the present invention are equally applicable for generating any duty cycle level. Additionally, while a preferred implementation of the invention is in the form of CMOS process technology, other process technologies such as bipolar, biCMOS, SiGe, GaAs, etc. are equally beneficial in carrying out the present invention.

What is claimed is:

1. A duty cycle correction circuit for changing the duty cycle for a differential periodic signal, the duty cycle correction circuit including:

input circuitry for receiving a first differential signal, the differential signal including a first signal component and a complement signal component, each of the signal components having initial high and low signal levels and respective first and second DC bias levels, the input circuitry including a differential output having a first path for propagating the first signal component and a second path for propagating the complement signal component;

programmable load circuitry coupled to the differential output and having a programmable input, the load circuitry operative to programmably vary the DC bias level of at least one of the signal components; and a differential gain amplifier coupled to the first differential output and disposed downstream of the load circuitry.

2. A duty cycle correction circuit according to claim 1 wherein the input circuitry comprises:

a differential buffer amplifier.

3. A duty cycle correction circuit according to claim 2 wherein the differential buffer amplifier comprises a CMOS differential buffer amplifier.

4. A duty cycle correction circuit according to claim 1 wherein the programmable load circuitry comprises:
  first and second current sources coupled to the first and second paths.

5. A duty cycle correction circuit for changing the duty cycle for a differential periodic signal, the duty cycle correction circuit including:
  means for receiving a first differential signal, the differential signal including a first signal component and a complement signal component, each of the signal components having initial high and low signal levels and respective first and second DC bias levels, the means for receiving including a differential output having a first path for propagating the first signal component and a second path for propagating the complement signal component;
  means for programmably varying the DC bias level of at least one of the signal components; and
  means for amplifying the first differential output and disposed downstream of the means for programmably varying the DC bias level.

6. A duty cycle correction circuit according to claim 5 wherein the means for receiving comprises input circuitry including a differential buffer amplifier.

7. A duty cycle correction circuit according to claim 5 wherein the means for programmably varying the DC bias level comprises:
  means for loading the differential output and having a programmable input.

8. A duty cycle correction circuit according to claim 7 wherein the means for loading comprises programmable load circuitry including first and second current sources coupled to the first and second paths.

9. A duty cycle correction circuit according to claim 5 wherein the means for amplifying comprises a differential gain amplifier.

10. Automatic test equipment for testing semiconductor devices, the automatic test equipment including timing circuitry having:
  a differential clock source for generating a differential clock signal;
  fanout circuitry for distributing the differential clock source to a plurality of timing circuits;
  a timing generator having an input for receiving a differential clock signal of a desired duty cycle; and
  a duty cycle control circuit disposed at the input of the timing generator to selectively modify the duty cycle of the differential clock signal to match the desired duty cycle, the duty cycle control circuit including
    input circuitry for receiving a first differential signal, the differential signal including a first signal component and a complement signal component, each of the signal components having initial high and low signal levels and respective first and second DC bias levels, the input circuitry including a differential output having a first path for propagating the first signal component and a second path for propagating the complement signal component;
    programmable load circuitry coupled to the differential output and having a programmable input, the load circuitry operative to programmably vary the DC bias level of at least one of the signal components; and
    a differential gain amplifier coupled to the first differential output and disposed downstream of the load circuitry.

11. A method of changing the duty cycle of a differential signal, the differential signal having a first signal component and a complement signal component, each of the signal components having initial high and low signal levels and respective DC bias levels, the method including the steps:
  modifying the DC bias level of one of the signal components until the average value of one component substantially equals the average value of the other component; and
  restoring the initial high and low signal levels.

12. A method according to claim 11 wherein the modifying step includes:
  buffering the differential signal with a differential buffer having a differential output; and
  loading the differential output to form the modified differential signal.

13. A method according to claim 11 wherein the restoring step includes:
  differentially amplifying the modified differential signal.

* * * * *